United States Patent [19]

Chambaere et al.

[11] Patent Number: 4,935,115

[45] Date of Patent: Jun. 19, 1990

[54] METHOD AND APPARATUS FOR COLD SPUTTER CLEANING AN ELONGATED METAL SUBSTRATE

[75] Inventors: Daniël Chambaere, Copley, Ohio; Wilfried Coppens, Kortrijk-Marke, Belgium; Hugo Lievens, Gent, Belgium; Roger De Gryse, Oosterzele, Belgium; Alex Colpaert, Zulte; Joost Vennik, Aalter, Belgium; Robert Hoogewijs, De Pinte, Belgium; Norbert Van Wassenhove, Merelbeke, Belgium

[73] Assignee: N.V. Bekaert S.A., Zwevegem, Belgium

[21] Appl. No.: 261,043

[22] Filed: Oct. 21, 1988

[30] Foreign Application Priority Data

Oct. 21, 1987 [BE] Belgium ............................. 8701197

[51] Int. Cl.$^5$ ............................. C23F 4/00; C23F 4/04
[52] U.S. Cl. ............................. 204/192.32; 204/192.35; 204/298.35; 204/298.37; 156/345; 156/643; 134/1
[58] Field of Search ................. 204/192.32, 192.35, 204/298 EM, 298 CS, 298 SM, 298 MC, 298 ME; 156/345, 643; 134/1

[56] References Cited

U.S. PATENT DOCUMENTS

| | | | |
|---|---|---|---|
| 2,916,409 | 12/1959 | Bucek | 204/192.16 |
| 3,326,177 | 6/1967 | Taylor | 118/718 |
| 3,654,108 | 4/1972 | Smith, Jr. | 204/164 |
| 3,728,246 | 4/1973 | Barkhudarov et al. | 204/298 |
| 3,884,793 | 5/1975 | Penfold et al. | 204/298 |

FOREIGN PATENT DOCUMENTS 1283645 11/1968 Fed. Rep. of Germany .
1492429 8/1967 France .
948554 2/1964 United Kingdom .

OTHER PUBLICATIONS

Patent Abstracts of Japan, vol. 4, No. 173 (C-32)[655], Nov. 29, 1980; & JP-A-55 110 782 (Hitachi Seisakusho K.K.) 26-08-1980).
Chemicals Abstracts, vol. 90, No. 24, Jun. 1979, p. 242, Abstract No. 190706p, Columbus, Ohio & JP-A-79 01 242 (Agency of Industrial Sciences and Technology) 08-01-1979.

*Primary Examiner*—Aaron Weisstuch
*Attorney, Agent, or Firm*—Foley & Lardner, Schwartz, Jeffery, Schwaab, Mack, Blumenthal & Evans

[57] ABSTRACT

The invention relates to a method and apparatus for continuously cleaning a long metal substrate, such as a wire, a band, a cord, etc., the long substrate to be cleaned being led through a vacuum chamber, whereinto an inert sputtering gas, such as argon, is fed, and a sufficiently high voltage being maintained between the substrate as cathode and an anode present in the chamber so that an electric discharge takes place between the two electrode, as a result of which the substrate is cleaned by inert gas ions bombarding it during its passage through the vacuum chamber, and the anode being formed by at least one annular electrode, fitted in a long casing of heat-radiation transmitting material and the long substrate being led through the casing in longitudinal direction. The invention further relates to the thus cleaned metal substrates, as well as to the objects of polymer material reinforced therewith.

18 Claims, 3 Drawing Sheets

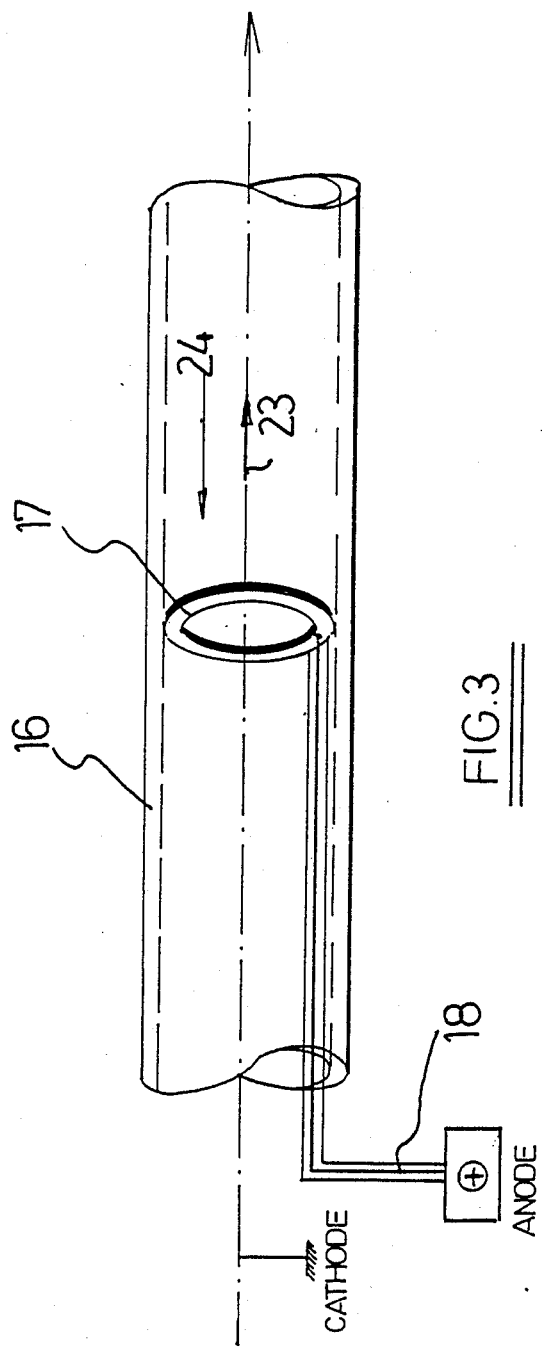

METHOD AND APPARATUS FOR COLD SPUTTER CLEANING AN ELONGATED METAL SUBSTRATE

The invention firstly relates to a method for continuously cleaning a long metal substrate, such as a wire, a band, a cord, etc., the long substrate to be cleaned being led through a vacuum chamber, whereinto an inert sputtering gas, such as argon, is fed, and a sufficiently high voltage being maintained between the substrate as cathode and an anode present in the chamber so that an electric discharge takes place between the two electrodes as a result of which the substrate is cleaned by inert gas ions bombarding it during its passage through the vacuum chamber.

Such a method for cleaning long, metal substrates is described in the Dutch patent application No. 86.02760 of the present applicant.

The continuous cleaning of long metal substrates is particularly important when these substrates are to be coated afterwards with a metal covering layer or when these substrates that have already been provided with a covering layer are to be embedded afterwards in a polymer material to be reinforced. The adhesion between substrate and covering layer, and also between a substrate provided with a covering layer and the polymer material to be reinforced, is considerably enhanced when the substrate is cleaned in a suitable way.

It has now been found that when applying the method according to the Dutch patent application 86.02760 for cleaning metal substrates, e.g. a wire, the cleaning effect of the gas discharge applied on the wire is caused by two different mechanisms. This cleaning effect is caused on the one hand by a heating of the wire, as a result of which many contaminants, those with relatively low vapor pressure such as hydrocarbons, for instance, evaporate or sublimate under the influence of the increase in the temperature of the wire. On the other hand, the cleaning effect is also caused by the actual ion bombardment on the wire itself or the actual sputtering, which has an excellent cleaning effect on the wire, even if the latter is kept cold, or in other words, if the increase in the temperature of the wire is avoided.

The heating or the increase in the temperature of the metal substrate can be very detrimental in some cases. This is particularly so when the metal substrate has already been provided with a metal covering layer, for instance of brass, zinc, etc. The increase in temperature or the thermal cleaning has a major side effect on the metal substrate coated with brass or zinc, namely, a preferential zinc segregation to the surface followed by a considerable evaporation of the zinc from the surface in the case of a brass covering layer; a considerable evaporation of the zinc at the surface in the case of a zinc covering layer.

It is the object of the invention to provide a suitable method for continuously cleaning a long, metal substrate, the cleaning effect through the sputtering effect on the substrate being considerable, but the increase in temperature or the thermal effect being avoided almost completely.

To this end, the invention contemplates the above-described method of cold sputtering wherein the anode is formed by at least one annular electrode, fitted in a long casing of heat-radiation transmitting material and the long substrate is led through the casing in longitudinal direction.

A major result of the present invention is a considerably lower average heating of the metal substrate as the substrate is no longer thermally protected by the surrounding anode and the casing consists of a material that transmits heat radiation. In particular, the material of the casing must transmit infrared rays. It has now been found possible with an annular electrode with an axial length of from 1 to 2 mm and a diameter of some 20 to 25 mm to select the parameters, such as pressure of the sputtering gas, feeding speed of the metal substrate, such as wire, in such a way that sputtering takes place over a substrate length that is up to 500 times or more the axial length of the annular electrode.

Preferably, the method according to the invention is applied to a steel, long substrate, such as a wire, a band, a cord, etc. that has already been provided with a covering layer of brass, zinc, etc.

With great preference, the thus cleaned steel substrate is embedded in a polymer material, such as rubber, to reinforce this polymer material.

The invention further relates to an apparatus for the continuous cleaning of a long substrate, such as a wire, a band, a cord, etc. at least comprising a chamber with means for creating a vacuum in this chamber, an anode set up in this vacuum chamber, elements for supplying an inert sputtering gas, such as argon, to this vacuum chamber, means for continuously guiding the long substrate through the high-vacuum chamber, and means for maintaining a sufficiently high voltage between the substrate as cathode and the anode present in the chamber, so that an electric discharge takes place between these two electrodes. The apparatus according to the invention is characterized in that the anode is formed by at least one annular electrode, which is fitted in a long casing of heat-radiation transmitting material.

Preferably, the long casing forms a circular cylindrical surface and is made of glass.

Finally, the invention also relates to the metal substrates cleaned in accordance with the method and in the apparatus according to the invention, as well as to the objects of polymer material, such as rubber, that have been reinforced with such cleaned metal substrates.

The invention will now be illustrated in the following description with reference to the accompanying drawings wherein:

FIG. 3 shows an important part of the apparatus according to the invention.

Figure 1:
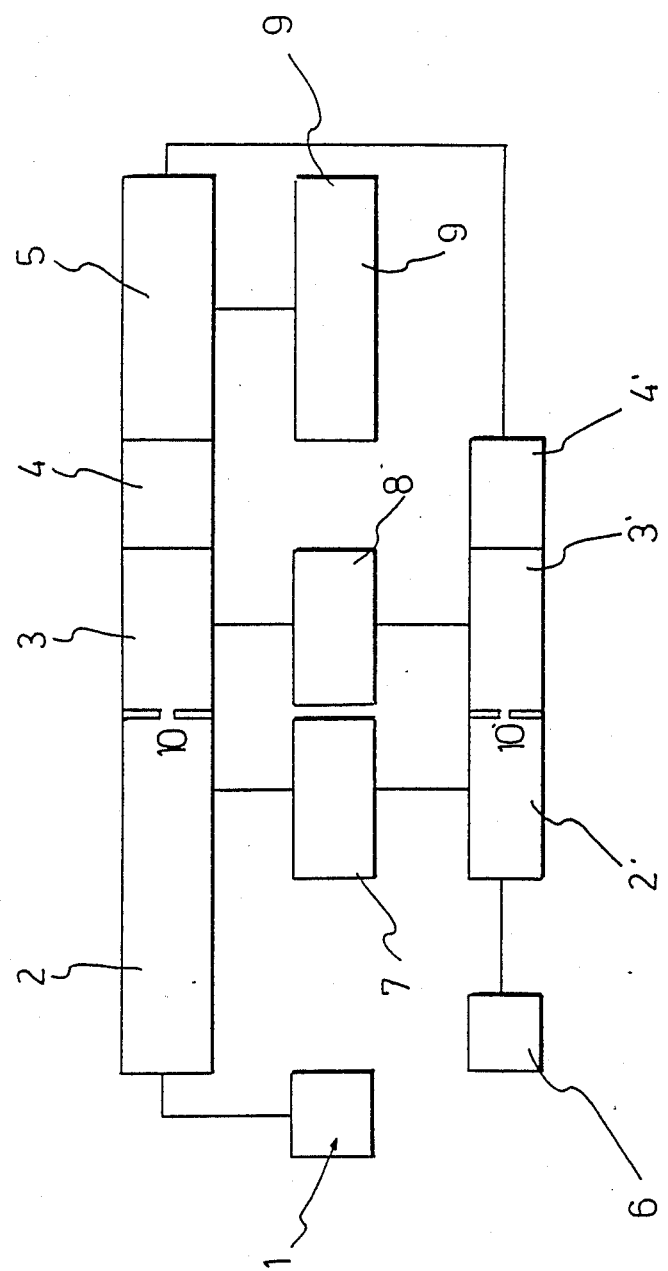
FIG. 1 shows a block diagram of a complete process line, the apparatus according to the invention constituting part of the line.

In FIG. 1, parts of a complete process line are represented with reference numbers 1-9, the apparatus according to the invention being represented with reference number 5. The long metal substrate to be cleaned is paid off from a reel or element of like kind in a station 1 and is led into the actual cleaning apparatus 5 via the chambers 2, 3 and with valve 4, then to be rewound on a take-up reel 6 via the chambers 2' and 3' with valve 4'. Such a process line is for instance represented in British Patent 1,362,735 wherein a vacuum space is preceded and followed by two vacuum chambers or locks.

The vacuum chambers 2 and 2' are connected to a known vacuum pump 7; whereas the chambers 3 and 3' are connected to a rotary valve pump 8. The actual working space or vacuum space 5 is connected to a turbomolecular pump 9. Feed-through elements 10, 10' of suitable types are present between the atmosphere (pay-off and take-up stations 1, 6) and the chambers 2, 2'; respectively between the chambers 2, 3 and 2', 3'. In addition to feed-through elements of the type 10 and 10', there are also hermetically sealable valves 4 and 4' between the chambers 3 and 5 and 3' and 5, respectively.

The operation of the process line is as follows. A vacuum of $10^{-1}$ to $10^{-2}$ Torr is created in the chambers 2 and 2', by means of the roots pump 7, with a flow rate of 500 m$^3$ per hour, for instance. A still better vacuum, of $10^{-2}$ Torr or lower, for instance, is created in the chambers 3 and 3', by means of the pump 8, for instance with a flow rate of 10 m$^3$ per hour. A high vacuum, of $10^{-4}$ to $10^{-7}$ Torr for instance, is created in the vacuum space 5 by means of the turbomolecular pump 9. The valves 4 and 4' are completely closed while a vacuum is created by pumping in the space 5. When this condition is reached, the line is ready for cleaning of the long substrate 11 to be started when the valves 4 and 4' are opened.

Figure 2:
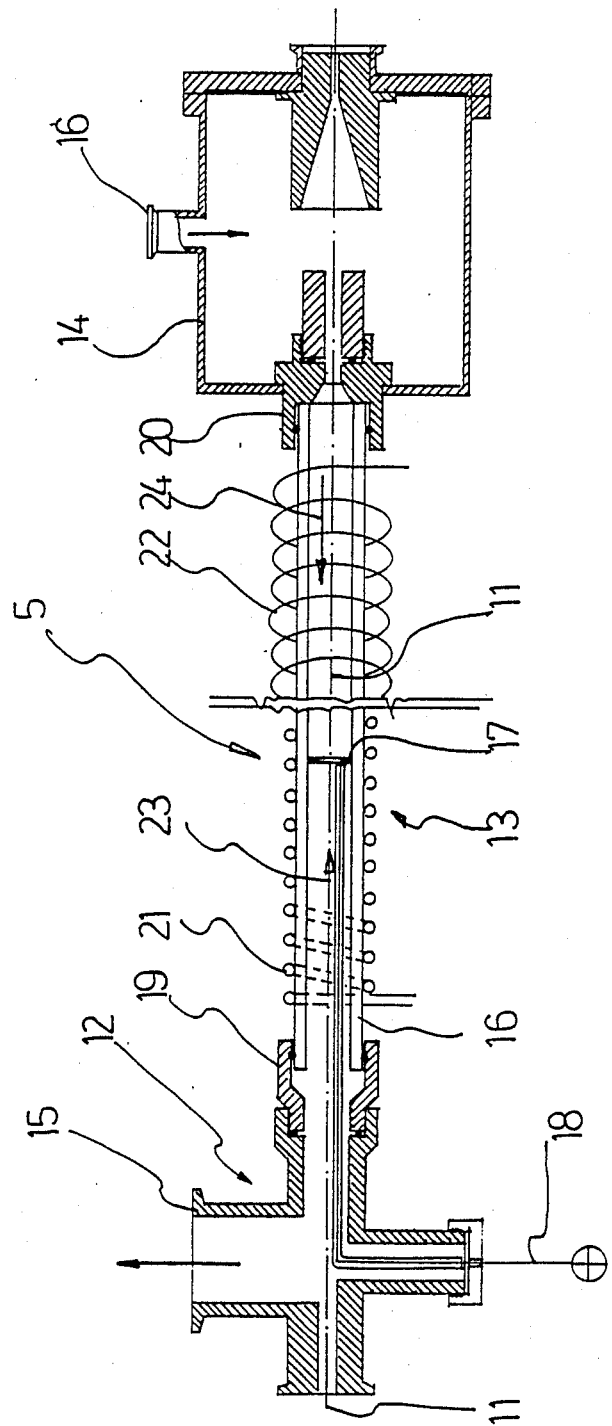
FIG. 2 shows a schematic longitudinal section through an apparatus according to the invention.

A typical embodiment of the vacuum space or vacuum chamber 5 is schematically represented in longitudinal section in FIG. 2. This vacuum space 5 consists of three interconnected spaces 12, 13 and 14. The space 12 is provided with connecting elements 15 for the turbomolecular pump 9, whereas the space 14 is provided with connecting elements 16 for the supply of an inert gas, such as argon. The actual apparatus 13 for cleaning the long substrate 11 is inserted between the vacuum spaces 12 and 14.

The space 13 consists of a long casing 16, preferably with a circular cylindrical surface, of a material, glass for instance, that transmits heat radiation. A circular anode 17 with insulated supply wire 18 for applying the voltage has been fitted in this casing 16. Both ends of the glass casing or tube 16 are fitted in sealing supporting elements 19, 20 in the walls of the contiguous vacuum spaces 12, 14. Cooling elements 21 have been fitted round the glass tube 16 for the cooling of the surface of the tube 16. Further, a coil 22 has been fitted round the glass tube or casing 16 to generate a magnetic field in the tube 16. For the sake of the clarity of FIG. 2, the cooling elements 21 and the coil 22 are only partially represented.

FIG. 3 is another, detailed representation of part of the glass tube or casing 16 with the annular anode 17 set up therein with insulated supply wire 18 for applying the voltage to the annular electrode 17. The tube 16 has, for instance, a length of 500 mm and a diameter of 25 mm.

The method for cleaning a long substrate 11, such as a wire, a band, etc. is as follows. When the line is ready for the method to be started, the substrate 11 to be cleaned is led through the vacuum chamber 5 in the direction of the arrow 23. An inert sputtering gas, such as argon, is constantly fed into the vacuum chamber 5 or into the spaces 12, 13 and 14 until a pressure of between 0.01 Torr and 10 Torr is reached. A sufficiently high voltage is maintained between the annular anode 17 and the substrate 11 as cathode, so that a plasma is formed between the two electrodes, e.g. at a voltage ranging between 100 to 1000 Volt with current intensities of between 50 and 200 mA. The substrate 11 is cleaned by the inert argon ions bombarding it from the plasma between the substrate 11 as cathode and the annular electrode 17 as anode or, in other words, the ion bombardment on the wire itself, the actual sputtering, has an excellent cleaning effect on the wire. Preferably, the substrate 11 will be kept at ground potential. The apparatus according to the invention also allows to apply triode sputtering or, in other words, it is also possible to install an additional independent source of electrons, e.g. a thermal cathode.

The method according to the invention is particularly applied to metal substrates, such as steel wires, steel cords, etc., that are provided with a covering layer of zinc, brass, etc. During cold sputtering according to the invention, the steel wires, steel cords, etc. provided with a covering layer are effectively cleaned without the temperature of the substrate 11 being raised considerably. To prevent a temperature rise in the space 13, this space 13 is also cooled by means of cooling elements 21.

A further characteristic of the method according to the invention consists in that the inert sputtering gas, such as argon, is led through the casing or tube 16 in the direction of the arrow 24, thus the substrate 11 and the sputtering gas are guided in opposite direction inside the vacuum space 13.

The method according to the invention is further characterized in that the cleaned substrate 11 is embedded in a vulcanizable elastomer, such as rubber, preferably immediately after the cleaning.

Still many improvements can be made within the scope of the invention, with regard to both method and apparatus. For instance, a coil 22 is fitted round the tube 16 to generate a magnetic field in the space 13, thus increasing the probability of ionization of the sputtering gas. This leads to a higher plasma density, resulting in a further improvement of the quality of the cleaned substrate 11.

We claim:

1. A method for continuous cleaning of an elongated substrate, comprising the steps of:
   leading an elongated substrate to be cleaned through an elongated vacuum chamber, said vacuum chamber having at least a first short axial length annular electrode fitted in an elongated casing of heat-radiation transmitting material, said elongated substrate being a second electrode;
   introducing an inert sputtering gas into said vacuum chamber;
   applying a voltage across said first and second electrodes; and
   cold sputtering said elongated substrate with said sputtering gas, whereby, due to the voltage across said first and second electrodes, an electrical discharge occurs so that said substrate is cleaned by inert gas ions precipitating thereon.

2. The method according to claim 1, further comprising cooling at least a portion of said vacuum chamber.

3. Method according to claim 1, characterized in that the elongated casing is a circular cylindrical surface.

4. Method according to claim 1, characterized in that the elongated substrate is maintained at ground potential.

5. Method according to claim 1, characterized in that the inert sputtering gas and the substrate to be cleaned are led through the elongated casing in opposite directions.

6. Method according to claim 1, characterized in that the elongated substrate is made of steel.

7. Method according to claim 6, characterized in that the steel substrate is provided with a covering layer.

8. Method according to claim 7, characterized in that the covering layer is made of brass or zinc.

9. Method according to claim 1, characterized in that the elongated casing (16) is made of glass.

10. Method according to claim 1, characterized in that the thus cleaned substrate is embedded in a polymer material.

11. Apparatus for the continuous cleaning of an elongated substrate comprising:
a chamber,
means for creating a vacuum in said chamber, thus forming a vacuum chamber,
an anode disposed in said vacuum chamber,
means for supplying an inert sputtering gas to said vacuum chamber,
means for continuously guiding the long substrate through said vacuum chamber, and
means for maintaining a sufficiently high voltage between the substrate as cathode and the anode present in the chamber, so that an electric discharge takes place between these two electrodes,
wherein the anode is formed by at least one short axial length annular electrode, which is fitted in an elongated casing of heat-radiation transmitting material so that the temperature of the elongated substrate remains substantially constant.

12. Apparatus according to claim 11, wherein the elongated casing is a circular cylindrical surface.

13. Apparatus according to claim 11, wherein the elongated casing is made of glass.

14. Apparatus according to claim 11, further comprising cooling elements fitted round the elongated casing.

15. Apparatus according to claim 11, further comprising a coil fitted around the elongated casing to generate a magnetic field.

16. Apparatus according to claim 11, wherein the vacuum chamber comprises three interconnected spaces said interconnecting spaces being the elongated casing of heat-radiation transmitting material connected at both ends to vacuum spaces.

17. Apparatus according to claim 16, wherein the ends of the elongated casing are fitted in sealing supporting elements in the walls of the vacuum spaces.

18. Apparatus according to claim 16, wherein a first of said vacuum spaces contiguous to the elongated casing is provided with connecting elements for a vacuum pump and wherein a second vacuum space contiguous to the elongated casing is provided with a supply inlet for inert gas.

* * * * *